(12) United States Patent
Libsch et al.

(10) Patent No.: US 11,158,506 B2
(45) Date of Patent: Oct. 26, 2021

(54) SELF-ALIGNED, OVER ETCHED HARD MASK FABRICATION METHOD AND STRUCTURE

(71) Applicant: INTERNATIONAL BUSINESS MACHINES CORPORATION, Armonk, NY (US)

(72) Inventors: Frank Robert Libsch, White Plains, NY (US); Ghavam G. Shahidi, Pound Ridge, NY (US); Ko-Tao Lee, Yorktown Heights, NY (US); Stephen M. Rossnagel, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 40 days.

(21) Appl. No.: 16/852,454

(22) Filed: Apr. 18, 2020

(65) Prior Publication Data

US 2020/0251336 A1 Aug. 6, 2020

Related U.S. Application Data

(62) Division of application No. 15/892,395, filed on Feb. 8, 2018, now Pat. No. 10,679,853.

(51) Int. Cl.
*H01L 21/033* (2006.01)
*H01L 21/311* (2006.01)
*H01L 21/027* (2006.01)

(52) U.S. Cl.
CPC ...... *H01L 21/0332* (2013.01); *H01L 21/0273* (2013.01); *H01L 21/0337* (2013.01);
(Continued)

(58) Field of Classification Search
CPC ............. H01L 21/0332; H01L 21/0337; H01L 21/0338; H01L 21/027; H01L 21/31608;
(Continued)

(56) References Cited

U.S. PATENT DOCUMENTS

| 4,654,119 A | 3/1987 | Cook |
| 5,683,561 A | 11/1997 | Hollars et al. |

(Continued)

FOREIGN PATENT DOCUMENTS

| JP | 63139844 A | 6/1988 |
| JP | 04031395 A | 2/1992 |
| JP | 10226595 A | 8/1998 |

OTHER PUBLICATIONS

List of IBM Patents or Applications Treated as Related, 2 pgs.
(Continued)

*Primary Examiner* — Thanh T Nguyen
(74) *Attorney, Agent, or Firm* — Intelletek Law Group, PLLC; Gabriel Daniel. , Esq.

(57) ABSTRACT

A hard mask and a method of creating thereof are provided. A first layer is deposited that is configured to provide at least one of a chemical and a mechanical adhesion to a layer immediately below it. A second layer is deposited having an etch selectivity that is faster than the first layer. A third layer is deposited having an etch selectivity that is slower than the first and second layers. The third layer has a composite strength that is higher than the first and second layers. A photoresist layer is deposited on top of the third layer and chemically removed above an inner opening. The third layer and part of the second layer are anisotropically etched through the inner opening. The second layer and the first layer are isotropically etched to create overhang regions of the third layer.

17 Claims, 10 Drawing Sheets

(52) U.S. Cl.
CPC .... *H01L 21/0338* (2013.01); *H01L 21/31116* (2013.01); *H01L 21/31144* (2013.01)

(58) Field of Classification Search
CPC ......... H01L 21/32139; H01L 21/31144; H01L 21/31116; H01L 21/0273; H01L 21/0217; H01L 21/02211; H01L 21/02271; H01L 21/02274; H01L 21/02126; Y02E 60/10; H01M 4/049; H01M 4/0421; H01M 4/0404; H01M 10/0436; H01M 10/0585; H01M 10/052; H01M 10/0562
See application file for complete search history.

(56) References Cited

U.S. PATENT DOCUMENTS

| | | | |
|---|---|---|---|
| 6,235,621 | B1 | 5/2001 | Jeng |
| 6,263,679 | B1 | 7/2001 | Paynting |
| 6,376,379 | B1 | 4/2002 | Quek et al. |
| 6,383,945 | B1 | 5/2002 | Huang et al. |
| 6,551,874 | B2 | 4/2003 | Pohl et al. |
| 6,869,722 | B2 | 3/2005 | Kearl |
| 7,001,783 | B2 | 2/2006 | Costrini et al. |
| 7,094,500 | B2 | 8/2006 | Ugaji et al. |
| 8,062,708 | B2 | 11/2011 | Snyder et al. |
| 9,018,098 | B2 | 4/2015 | Winniczek et al. |
| 9,614,256 | B2 | 4/2017 | Karlovsky et al. |
| 9,941,507 | B2 | 4/2018 | Pirk et al. |
| 2004/0058237 | A1 | 3/2004 | Higuchi et al. |
| 2010/0133092 | A1 | 6/2010 | Mashimo et al. |
| 2013/0149592 | A1 | 6/2013 | Hayashi et al. |
| 2014/0295668 | A1* | 10/2014 | Avasarala ......... H01L 21/31116 438/696 |
| 2015/0084157 | A1 | 3/2015 | Tegen et al. |
| 2015/0086809 | A1 | 3/2015 | Lemke et al. |
| 2015/0165769 | A1* | 6/2015 | Nystrom ................ B41J 2/1642 347/54 |
| 2015/0188195 | A1 | 7/2015 | Matsushita |
| 2015/0280287 | A1 | 10/2015 | Joshi et al. |
| 2015/0340727 | A1 | 11/2015 | Iwamoto |
| 2015/0349370 | A1 | 12/2015 | Snyder et al. |
| 2017/0073805 | A1 | 3/2017 | Gittleman |
| 2017/0114444 | A1 | 4/2017 | Lemberger |
| 2017/0155256 | A1 | 6/2017 | Fujimaki et al. |
| 2017/0287694 | A1* | 10/2017 | Robello ................ G03F 7/0388 |
| 2018/0006333 | A1 | 1/2018 | Brew |
| 2018/0211921 | A1* | 7/2018 | Lee ....................... H01L 23/528 |
| 2018/0315965 | A1 | 11/2018 | Fallourd |
| 2019/0312298 | A1 | 10/2019 | Ni |
| 2019/0319252 | A1 | 10/2019 | Hasegawa et al. |

OTHER PUBLICATIONS

Park, Y. S. et al., "All-Solid-State Lithium Thin-Film Rechargeable Battery with Lithium Manganese Oxide" Electrochemical and Solid-State Letters (1999); vol. 2:2, pp. 58-59.

Kutbee, A. T. et al., "Free-Form Flexible Lithium-Ion Microbattery"; IEEE Transactions on Nanotechnology (2016); vol. 15:3; pp. 402-408.

* cited by examiner

1200 ⟶

| Film | Chemistry Gases | Temp of Deposition (C) |
|---|---|---|
| SiO2 (Thermal) | SiH4 + CO2 + H2 | 850 - 950 |
| | SiCl2H2 + N2O | 850 - 900 |
| | SiH4 + N2O | 750 - 850 |
| | SiH4 + NO | 650 - 750 |
| | Si(OC2H5)4 | 650 - 750 |
| | SiH4 + O2 | 400 - 450 |
| SiO2 (Plasma) | SiH4 + N2O | 200 - 350 |
| SixNy (Thermal) | SiH4 + NH3 | 700 - 900 |
| | SiCl2H2 + NH3 | 650 - 750 |
| SixNy (Plasma) | SiH4 + NH3 | 200 - 350 |
| | SiH4 + N2 | 200 - 350 |
| Poly-Si | SiH4 + N2O | 600 - 650 |
| a-Si (Plasma) | SiH4 | 400 - 450 |

FIG. 12

| Deposition | Plasma | SiH4 + O2 | TEOS | SiCl2H2 + N2O | LPCVD | Plasma |
|---|---|---|---|---|---|---|
| Temp. (C) | 200 | 400 | 750 | 900 | 700 - 800 | 250 - 350 |
| Composition | $SiO_{1.9}(H)$ | $SiO_2(H)$ | $SiO_2$ | $SiO_2(Cl)$ | $Si_3N_4(H)$ | $SiN_xH_y$ |
| Step Coverage | Nonconformal | Nonconformal | Conformal | Conformal | Conformal | Nonconformal |
| Thermal Stability | Looses H | Densifies | Stable | Looses Cl | | |
| Density (g/cm3) | 2.3 | 2.1 | 2.2 | 2.2 | 2.9 - 3.1 | 2.4 - 2.8 |
| Refractive index | 1.47 | 1.44 | 1.46 | 1.46 | 2.01 | 1.8 - 2.5 |
| Stress ($10^9$ dyn/cm2) | 3 compressive to 3 tensile | 3 tensile | 1 compressive | 3 compressive | 10 compressive | 2 compressive to 5 tensile* |
| Etch rate (A/min) (100:1 H2O:HF) | 400 | 60 | 30 | 30 | Very small | Small |
| Dielectric Strength $10^6$ V/cm | 3 to 6 | 8 | 10 | 10 | 10 | 5 |

SELF-ALIGNED, OVER ETCHED HARD MASK FABRICATION METHOD AND STRUCTURE

BACKGROUND

Technical Field

The present disclosure generally relates to semiconductor devices, and more particularly, to methods and devices of patterning hard masks used in fabrication of semiconductor devices.

Description of the Related Art

Today, there are different fabrication techniques to create a semiconductor device. Some masking techniques include photolithography, mechanical mask, and hard mask. The most popular is photolithography, where a pattern is written into a photoresist. Photolithography uses intense light to transfer a geometric pattern from a photomask to the photoresist. A series of chemical treatments then engrave the exposure pattern thereon, thereby enabling the deposition of various material in the desired pattern upon the material underneath the photo resist.

A mechanical mask, is a thin and rigid sheet of metal with adequately shaped holes through which material can be deposited directly on the wafer surface. The mask is adhered (e.g., clamped or taped) onto a wafer, which allows deposited geometries to reflect the shape of the openings in the sheet of metal. The resolution provided by mechanical masks is relatively low.

Somewhere in between photolithography and mechanical masks in resolution is a hard mask. It is a material that is used in semiconductor processing as an etch mask instead of a "soft" resist material.

SUMMARY

According to one embodiment, a patterning hard mask for fabricating a self-aligned structure is provided. The hard mask includes a first layer configured to provide at least one of a chemical and a mechanical adhesion to a layer immediately below it and having an etch selectivity that is faster than the layer immediately below it. There is a second layer located on top of the first layer and having an etch selectivity that is faster than the first layer. There is a third layer located on top of the second layer, the third layer having: an etch selectivity that is slower than the second and first layers, a composite strength that is higher than the first and second layers, and overhang regions extending over a cavity. The second layer is isotropically undercut to create the overhang regions of the third layer.

In one embodiment, the etch selectivity of the first layer is faster by at least a 10 to 1 ratio with respect to the layer immediately below it, and the etch selectivity of the second layer is faster by at least a 3 to 1 ratio with respect to the first layer.

In one embodiment, the first layer comprises polysilicon (poly-Si), the second layer comprises silicon dioxide ($SiO_2$), and the third layer comprises silicon nitride (SiN).

In one embodiment, the first layer comprises silicon nitride (SiN), the second layer comprises silicon dioxide ($SiO_2$), and the third layer comprises silicon nitride (SiN).

In one embodiment, the second layer has material properties that allow it to delaminate more readily than the first and third layers during a hard mask removal etch, such that the hard mask floats away from the fabricated self-aligned structure.

In one embodiment, the hard mask has an inner opening and an outer opening.

According to one embodiment, a method of creating a hard mask for the fabrication of a self-aligned semiconductor structure is provided. A first layer is deposited that is configured to provide at least one of a chemical and a mechanical adhesion to a layer immediately below it and having an etch selectivity that is faster than the layer immediately below it. A second layer is deposited on top of the first layer. The second layer has an etch selectivity that is faster than the first layer. A third layer is deposited on top of the second layer, the third layer having an etch selectivity that is slower than the first and second layers, and a composite strength that is higher than the first and second layers. A photoresist layer is deposited on top of the third layer. The photoresist layer is chemically removed above an inner opening. The third layer and part of the second layer are anisotropically etched through the inner opening. The second layer and the first layer are isotropically etched to create overhang regions of the third layer.

In one embodiment, the etch selectivity of the first layer is faster by at least a 10 to 1 ratio with respect to the layer immediately below it, and the etch selectivity of the second layer is faster by at least a 3 to 1 ratio with respect to the first layer.

In one embodiment, the first layer comprises polysilicon (poly-Si), the second layer comprises silicon dioxide ($SiO_2$), and the third layer comprises silicon nitride (SiN).

In one embodiment, the first layer comprises silicon nitride (SiN), the second layer comprises silicon dioxide ($SiO_2$), and the third layer comprises silicon nitride (SiN).

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

FIG. 12 is a table of gas reactants for depositing films.

FIG. 13 is a table of film properties for different deposition methods.

DETAILED DESCRIPTION

Overview

Figure 1:
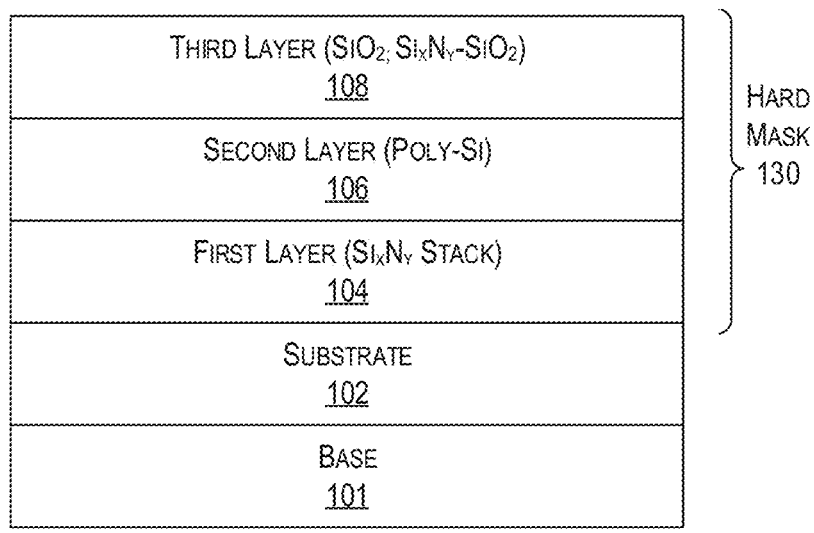
FIG. 1 is a simplified cross-section view of hard mask layers, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

The present disclosure relates to methods and systems of patterning hard masks used in fabrication of semiconductor devices, such as integrated circuits (ICs), discrete devices, Micro-Electro-Mechanical Systems (MEMS), Nano-Electro-Mechanical (NEM) Devices and, photonic devices, as well as solid-state batteries. Conventional mechanical masks, usually made of thin and planar metal, have been used by clamping onto existing wafers or substrates. They provide a mechanical stencil through which film deposition are patterned onto the wafer or substrate. The mechanical mask clear openings allow the film deposition to reach the wafer or substrate, while the non-clear mask area blocks the film deposition from reaching the wafer or substrate. In this manner, the film deposition pattern on the wafer or substrate replicates the mechanical mask pattern. However, mechanical masks pose various challenges.

One challenge in mechanical masks is the deposited film build-up that reduces the dimensions of the clear (e.g., holes) area of the mask with each film deposition, resulting in a dimensional change of the pattern from deposition to deposition. One solution to this challenge is the removal of the deposited film after each film deposition. Although possible, this solution can be time consuming, costly, and prevents in-situ multiple film depositions Another challenge with mask film buildup associated with mechanical masks is the increase in outgassing and consequent increase in vacuum pump down times in the deposition tools. Further, there may be unwanted flaking off of particles from the mask film buildup, resulting in wafer or substrate yield loss. Still further, mechanical masks may have a lack of conformity with the wafer or substrate, which is aggravated by any additional underlying device topology, resulting in what is known in the art as "film deposition creep." The practice of forceful clamping of the mechanical mask to the wafer or substrate to provide better conformity often results in physical damage/crushing/marring of the underlying wafer or substrate.

One approach in avoiding the challenges associated with mechanical masks is to use solid-state photoresist masks, as mentioned previously. However, the photo-sensitive polymer material (i.e., photoresist) used may be susceptible to moisture uptake during the aqueous development cycle, which results in outgassing in vacuum deposition tooling. Further, photoresist may outgas and the polymer material, contaminate the deposition tooling chamber, and lower the quality of deposited films. Still further, photoresist has a lower glass transition temperature (usually <300 C) that may preclude its use in higher temperature deposition tooling.

Another recent approach has been depositing a sacrificial solid-state film of uniform construction, patterned with photoresist, removal of the photoresist, deposition of the intended device film, and removal of the sacrificial solid-state film. Although this is an improvement in that it allows device fabrication in higher temperature tooling (in reference to what is possible with photoresist masks), the sacrificial solid-state film mask thickness should be kept thin to avoid sacrificial solid-state film stress buildup with the substrate underneath and results in delamination, damage to the underlying substrate or previously deposited device films, and/or particle contamination in the device fabrication tooling and substrate.

In one aspect, the methods and systems disclosed herein provide hard mask tooling for the manufacture of in-situ deposition of solid state thin films to fabricate various semiconductor devices. To that end, in one embodiment, an apparatus is provided for fabricating solid thin film devices, such as solid state thin film batteries or other solid state thin film electrical, optical, and MEMS devices.

The teachings herein enable self-aligned sequential films and scalability to smaller dimensions beyond what exists today with conventional mechanical masks. Further, the methods disclosed herein are compatible with in-situ masking in deposition tools. Unlike known solid-state photoresist masks, the hard mask discussed herein does not present a chemical contamination concern or have an incompatible lower temperature limit compared to photoresist masks.

By virtue of using the same hard mask pattern, the semiconductor structures created are self-aligned and the process is simplified compared to other processes that use additional mask layers for the deposition of films. Such self-alignment facilitates scalability and further miniaturization. Stated differently, since various layers discussed herein are self-aligned by virtue of using a single hard mask pattern for all film depositions of the device being fabricated, regions that are typically wasted are avoided, thereby yielding a more compact semiconductor device size. More accurate alignment of film layers and smaller dimension structures, such as thin-film batteries, semiconductor devices, MEMS, etc., are now possible since they depend only on the deposition angle and not on any mask-to-mask alignment resolution or mask planarity and conformality issues of previous methods.

The manufacture of a semiconductor device by using the hard masks described herein typically results in lower cost of manufacture and larger throughput compared to photolithography or mechanical masks. An all in-situ solid state film deposition process facilitated by the hard masks herein substantially reduce exposing deposited solid state thin films to reactive ambient and wet chemical processing of the conventional photo masking, photo developing, and photo stripping. Further, the hard mask and method discussed herein provides a thicker solid-state mask without the previous limitations listed above. Further, this hard mask and method allows multiple device film depositions without the removal, of the sacrificial masks after each device film deposition and eliminates the multiple fabrication steps of repeating a new mask deposition, patterning and alignment for the next and each device film deposition. The techniques described herein may be implemented in a number of ways. Example implementations are provided below with reference to the following figures.

Example Layers of a Hard Mask

Reference now is made to FIG. 1, which is a simplified cross-section view of a hard mask, consistent with an illustrative embodiment. The topology 100 includes a base 101, substrate 102, and several layers related to a hard mask. The hard mask 130 includes a first layer 104, a second layer 106, and a third layer 108, wherein each layer has predetermined material properties to accommodate the layer(s) above and/or below it.

The base 101 may be silicon (Si). As described more fully below, the devices disclosed herein may be formed in and above a bulk substrate 102, such as Si, $SiO_2$, Silicon Nitride ($Si_xN_y$), which is the most thermodynamically stable of the silicon nitrides, and/or silicon on insulator (SOI) or other dielectric or semiconductor films. Accordingly, in various embodiments, the substrate 102 may be over a silicon on insulator (SOI) layer (not shown) or other dielectric to prevent leakage and to improve device performance. Other materials that may be used include sapphire, aluminum oxide, germanium, gallium arsenide (GaAs) or any of the other III-V periodic table compounds, indium phosphide (InP), silicon carbide (SiC), an alloy of silicon and germanium, etc. The substrate 102 can act as a conductor or an insulator, depending on the materials and concentrations chosen. Thus, as used herein, the term substrate 102 includes all forms of semiconductor structures. The substrate 102 serves as the foundation upon which various semiconductor structures can be built by use of the hard mask discussed herein.

In some embodiments, there may be a conductive electrode layer (not shown) between the substrate 102 and the first layer 104. This conductive electrode may be separated by gaps and may comprise a metal such as Ni, Pt, Al, Cu, any other appropriate metal or conductive semiconductor, or any combination thereof. The actual materials used and their relative proportions play a role in the material used in the first layer 104 of the hard mask 130, as discussed below.

The first layer 104 is selected to have material properties that provide a chemical and/or mechanical adhesion to a layer immediately below it (e.g., substrate 102, contact layer, or any other layer that has already been deposited). Chemical adhesion occurs when the two materials form a compound at the joint. Mechanical adhesion occurs when an adhesive material fills the voids or pores of the surface of the layer next to and holds the surfaces together by interlocking.

The first layer 104 has an etch selectivity that has an etch factor higher than the layer immediately below it. In one embodiment, the factor of the etch selectivity of the first layer has a ratio of at least 10 to 1 with respect to the layer immediately below it. In this way, the first layer can be etched away before significantly affecting the layer immediately below it, which is meant to be kept intact.

In various embodiments, the first layer 104 may be silicon dioxide ($SiO_2$), a composite of silicon dioxide and silicon nitride ($SiO_2$—$Si_xN_y$), silicon nitride ($Si_xN_y$), titanium (Ti), or tantalum (Ta), even poly-Si, depending on the material(s) immediately below it, such that the layer provides an effective chemical and/or mechanical adhesion to the layer below it, as well as the layer above it (i.e., second layer 106) in addition to providing the etch selectivity of faster etch rate compared to the layer immediately below it. Depending on the semiconductor device being fabricated, the layer immediately below it may be a substrate 102 that has a layer embedded therein, such as a metal electrode(s). To accommodate, the material(s) to which subsequent layers are to be adhered to, the first layer acts as an adhesion layer to form a chemical and/or mechanical adhesion thereto (e.g., metal electrode(s) and/or substrate) to survive subsequent film deposition tensile and/or compressive stress. Further, the first layer is operative to provide sufficient chemical etch selectivity with the subsequent hard mask layers.

The second layer 106 is located on top of the first layer 104 and configured to be isotropically etched. Stated differently, the second layer 106 has material properties that allow it to be removed more readily laterally and vertically compared to the third layer 108 to obtain a desired shape of the material after an etching. In one embodiment, the second layer 106 has an etch selectivity that has a faster etch factor than the first layer. For example, the etch selectivity of the second layer 106 may have faster etch ratio of at least 3 to 1 with respect to the first layer 104.

In various embodiments, the second layer 106 may $SiO_2$, poly silicon (poly-Si), a composite of silicon dioxide, or PolySi ($SiO_2$-poly-Si), depending on the material immediately below it, such that the layer provides an effective chemical and/or mechanical adhesion to the first layer 104, as well as the layer above it (i.e., third layer 108). In one embodiment, the second layer 106 is the thickest layer of the three hard mask layers. Further, it is desirable to engineer the three layers of the hard mask to have a low composite stress to ensure good hard mask 130 adhesion to the substrate 102 The thickness is greater than the total composite film thickness of the self aligned structure being created under a main opening of the hard mask discussed in more detail later in later FIGS. For example, the self-aligned structure being created may be a solid state thin film battery (SSTFB) that has multiple stacks. Accordingly, the thickness of the second layer 106 is adjusted such that it is taller than all the masks used to create the SSTFB. In one embodiment, the thickness of the second layer 106 is at least 2 times the total height of the layers of the self-aligned structure being fabricated under an opening of the hard mask.

Another consideration regarding the second layer 106 is that the material used should enable an undercutting of the hard mask layer via an anisotropic etch, such as a buffered oxide etch, a buffered hydrofluoric acid (HF) etch, $X_eF_2$ plasma etch, etc. Accordingly, the material used in the second layer 106 is selected such that during an anisotropic etch operative to remove the hard mask, the second layer 106 delaminates more readily than the first and second layers, thereby allowing the third and second layers to float away.

The third layer 108 is located on top of the second layer 106 and has an etch selectivity that is smaller than the second and first layers (106 and 104). Stated differently, the second and first layers (106 and 104) are etched away more readily than the third layer 108. Further, the third layer has a composite strength that is higher than the first and second layers (104 and 106). Having a higher composite strength makes it possible for the third layer 108 to be substantially thinner than the first and second layers (104 and 106). The composite strength and the thickness of the third layer 108 are salient considerations in that they make possible higher deposition angles of the structure being fabricated under an opening of the hard mask, which is explained in further detail later. In one embodiment, the thickness of the third layer 108 is one fourth or more thinner than the second layer 106. The minimum thickness may be based on the threshold strength required to prevent sagging (above a predetermined threshold) of the third layer when the second layer beneath it is removed under an opening of the hard mask.

In various embodiments, the third layer 108 may be a composite $SiO_2$—$Si_xN_y$, $SiO_2$, $Si_xN_y$, a photosensitive polymer, etc., depending on the material used for the second layer 106, such that the third layer 108 provides an effective chemical and/or mechanical adhesion to the second layer 106. Another consideration regarding the third layer 106 is that the material used should enable photolithographic patterning thereon, which is discussed in more detail later.

Controlling the film stress in the composite hard mask 130 determines adhesion strength to the underlying substrate. For example, $SiO_2$ has a compressive stress and $Si_xN_y$ exhibits a tensile stress, where the composite of the two films' stress can substantially cancel each other out to yield zero stress.

A lower temperature film deposition provides less dense films, which tend to etch at a faster rate. However, they provide poorer step coverage, which may affect, among other structures, hard masks deposited on a non-planar surface, such as thick electrodes that do not have sloped edges. A lower temperature film deposition may provide a more tailorable film stress, although other processing parameters, such as gas reactants, deposition pressure, and deposition frequency may also be controlled to influence the film stress.

A plasma assisted film deposition provides a lower temperature film deposition. Further, such deposition provides more hydrogen to be included in the film, which facilitates a faster film etching.

Returning to the issue of stress, internal or residual stress is typically present in thin films (sometimes referred to herein as layers), and may be introduced during film deposition. Some sources of such stress include differential thermal expansion of the film/substrate (because of the higher deposition temperature compared to resting temperature), mismatches between the lattice parameter between the films (or between the film and substrate), atomic peening, inclusion of foreign atoms, microscopic voids, variation of interatomic spacing with crystal size, recrystallization process, crystallite coalescence at grain boundaries and phase transformations.

Residual stress is the internal stress distribution locked into a film material. These stresses are present even after all external loading forces have been removed. They may be a result of the material obtaining equilibrium after it has undergone plastic deformation. As used herein, residual stress includes both thermal stress and intrinsic stress. Residual stresses in films can be either compressive or tensile. If the stress is large enough, it could lead to fracture of the substrate or film below it, the film above it, or any other interface between two deposited films. In extreme situations, where the different layers are not controlled by the methods discussed herein, the tensile residual stress may lead to film cracking and peeling away from the below substrate/film and compressive residual stress may lead to film buckling and delamination from the below substrate/film.

Delamination between film layers may be both encouraged and discouraged in different scenarios, but must be balanced to facilitate both, depending on the stage of the fabrication, For example, delamination between the third layer 108 and the second layer 106 should be avoided, whereas the delamination of the second layer 106 and the first layer 104 (and/or the first layer 104 and the substrate 102) may be encouraged when the hard mask 130 is no longer desired, such that it is etched away from the semiconductor device that is fabricated. Accordingly, delamination is carefully controlled herein.

Delamination may result from various factors, such as film stress, thickness of the film, and interfacial toughness. In one embodiment, delamination is controlled by regulating the interfacial toughness, which is a property that describes the ability of a material to resist fracture. For example, adhesion reducing layers that have a lower interfacial toughness than surrounding areas can be used to discourage delamination. For example, a compressively stressed film can be used together with a patterned adhesion reducing layer to creating micro-channels. As will be discussed in more detail later, the creation of the micro-channels is one of the reasons outer openings in the hard mask are introduced. A second reason for hard mask openings is with respect to a final removal of the sacrificial hard mask by allowing etchant to enter and undercut the second layer 106 of the hard mask.

A second way to prevent deformation and delamination is by using a composite film stack, that include films (i.e., layers) under predetermined compressive stress and tensile stress. Applicants have identified that the composite stack of the hard mask 130 has less total stress by compensating the compressive (or tensile) stress of films with the tensile (or compressive) stress of other films. Stated differently, the three layers 104 to 108 are configured to support each other and to counteract any stress existing on the substrate 102 just prior to the hard mask fabrication. In one embodiment, both ways (i.e., regulating the interfacial toughness and using a composite film stack) described above to prevent deformation and delamination are used in the multilayer hard mask 130 of the present disclosure.

Example Process for a Solid-State Battery

Figure 2A:
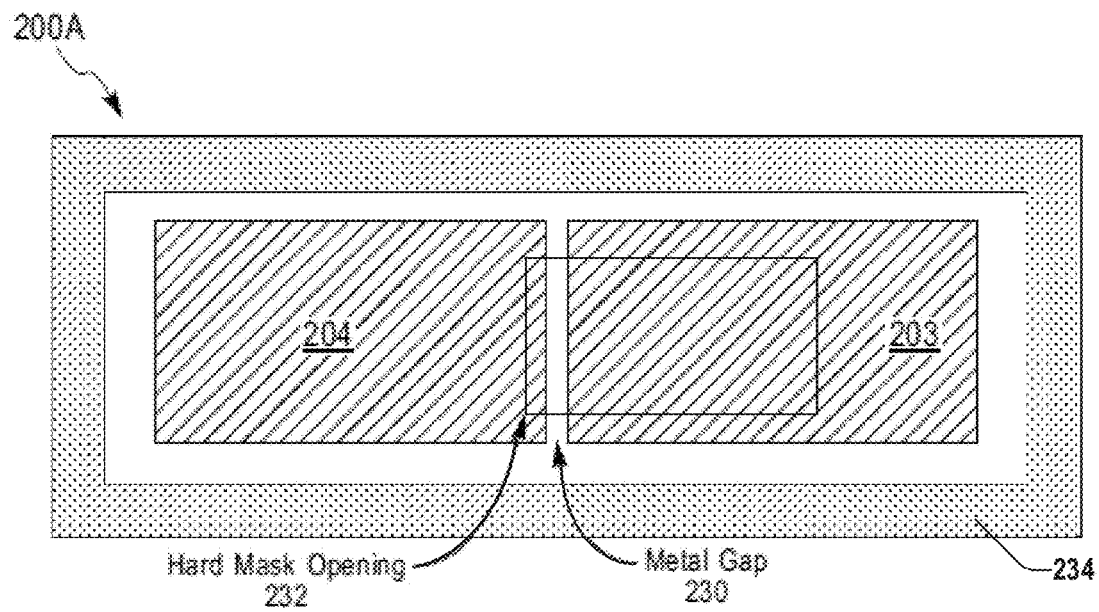
FIG. 2A is a top view of an example hard mask that may be used to create self-aligned structures under its opening, consistent with an illustrative embodiment.

With the foregoing description of the various layers of an example hard mask, it may be helpful to discuss an example process of manufacturing the same. To that end, FIG. 2A illustrates a top view of an example hard mask that may be used to create self-aligned structures under its opening. The hard mask 200A has an opening 232 under which various structures, including self-aligned structures can be created. In some scenarios, angle deposition may be used to create structures via the opening. These structures may have a larger footprint than the opening 232 itself by virtue of using angle deposition.

The hard mask 200A may include an outer opening 234 that has various purposes. First, when the hard mask 200A is used as a sacrificial mask, the second opening 234 (together with the first hard mask opening 232) is used to facilitate delamination of the hard mask from the substrate (insulator), such that the delamination occurs from the bottom up. In this way, the hard mask 200A is allowed to float away in a final etching step to remove the hard mask from the semiconductor device being fabricated. Second, the second opening 234 may serve as a stress reliever of the pressure exerted by the hard mask onto the substrate. For example, the hard mask 200A introduces a stress onto the underlying substrate (or structure it is grown on), which may be sufficient to cause delamination and damage the substrate by partially adhering and removing part of the substrate. Accordingly, the width of the outer opening may be adjusted based on the density of the hard mask (percentage of opening versus coverage) to prevent the hard mask 200A from crushing the substrate or inducing a curvature thereon, due to the hard mask weight or the hard mask residual stress that is multiplied by the continuous hard mask 200A area, respectively. The heavier the hard mask (e.g., due to its total height from the substrate), and/or the higher the residual hard mask stress, the wider and/or more numerous the outer opening may be.

The rectangular inner opening 232 serves as a conformal mask opening that enables self-aligned patterning of subsequent thin film depositions to produce self-aligned structures. In addition, the rectangle inner opening and rectangular outer opening 234 provide mask segmentation that enables hard mask adhesion to the layer below it through hard mask mechanical stress reduction and planarity improvement, particularly relevant for hard masks thicknesses >2 µm. Yet another aspect of the rectangular outer opening 234 is the facilitation or being an etch portal for hard mask removal from the final fabricated self-aligned structure. While rectangular inner and outer openings have been illustrated by way of example in FIG. 2A, it will be understood that other shapes such as circular, oval, trapezoidal, or any shape that can be photolithographically patterned with photoresist, are supported as well.

By way of example only, and not by way of limitation, the hard mask 200A illustrates conductive electrodes 203 and 204 that are separated by a metal gap 230. Accordingly, the hard mask 200A can be built on top of various pre-existing materials.

Figure 2B:
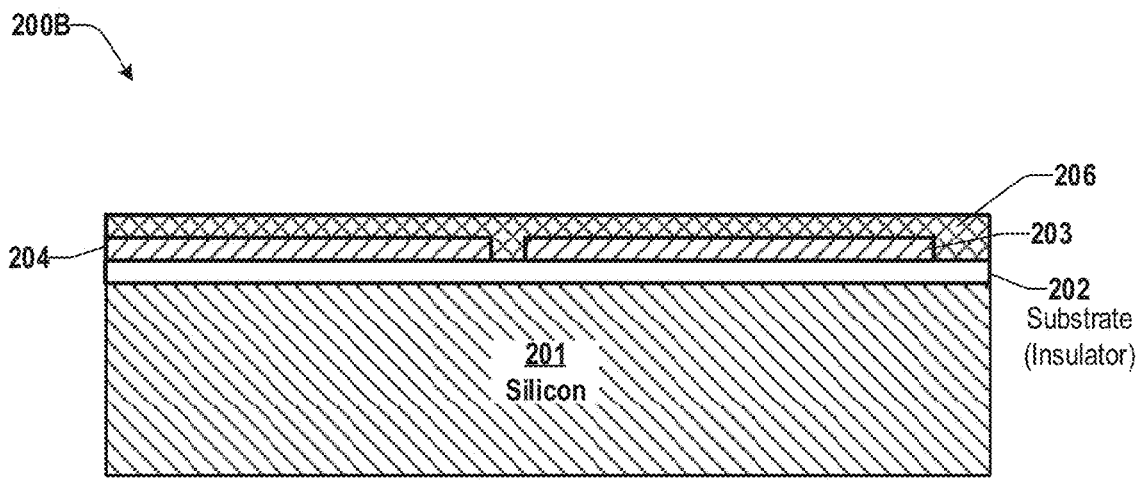
FIG. 2B is a side front-section view of a first layer of a hard mask, consistent with an illustrative embodiment.

FIG. 2B is a side front-section view of a first layer 206 of the hard mask, consistent with an illustrative embodiment. The side front-section view 200B illustrates a bulk material 201, which may be silicon (Si), on top of which there may be a substrate layer 202, which acts as an insulator between the structures above and the bulk 201. In various embodiments, there may be various structures already present (e.g., deposited) before the first had mask layer 206 is deposited, such as a first conductive electrode 203 and a second conductive electrode 204 that, in one embodiment, are coplanar. Stated differently, the first and second conductive electrodes 203 and 204 can be deposited at the same lithographic step on top of the substrate 202 before the formation of a hard mask.

The material of the first layer 206 is based on the material(s) immediately below it, such that the first layer 206 can provide a chemical and/or mechanical adhesion thereto. In the example of electrodes 203 and 204 and substrate 202. For example, the first layer 206 is preferably silicon nitride ($Si_xN_y$). However, titanium (Ti) may be used if the percentage of conductive material (conductors) are above a threshold percentage of materials immediately below first layer 206. Also, Ti has good adhesion behavior to several substrate oxides such as single crystal sapphire, magnesia, and quartz, $SiO_2$, and metals such as gold (Au), but not to glass. Similarly, tantalum (Ta) may be used as the first layer of the hard mask if the concentration of aluminum oxides onto which the first hard mask layer is deposited comprises aluminum oxides. Similarly, chromium (Cr) provides high binding strength with oxygen and therefore is able to de-passivate many material surfaces. In such cases, the first layer 206 comprising Cr will place the oxygen (O) atoms of oxide materials from layer 203, 204 and/or 202 in an interconnecting bridge position since Cr—O has binding energy similar to Si—O. However, if the binding strength of Cr—O is significantly higher than the internal binding strength of materials from layer 203, 204, and/or 202, delamination will result. For example, Cr will not provide the best adhesion on aluminum considering that the Cr—O binding energy is higher than the Al—O binding energy and that the atomic size of Al is much lower than Cr. Aluminum layers from layer 203, 204 and/or 202 quickly react with the ambient to form an interfacial aluminum oxides (AlO, $Al_2O_3$, etc.) film. It is this aluminum oxide film, not the aluminum, that would be adjacent to the first layer 206. Other materials, such as silicon dioxide ($SiO_2$), a composite of silicon dioxide and silicon nitride ($SiO_2$—$Si_xN_y$), etc., may be used instead to provide an effective chemical and/or mechanical adhesion to the material(s) of layers 203, 304, and/or 202 below. In some embodiments, mechanical adhesion may be promoted by mechanically roughening up and/or cleaning the materials below, for example, by reactive ion etching (RIE), argon (Ar) sputtering, or slight chemical etching, the materials immediately below the first layer 206 (before the first layer 206 is deposited). Further, the first layer 206 may involve mechanically roughening up the underlying material while simultaneously depositing the first layer 206. For example, Ti can be sputtered with additional ion bombardment (mechanically roughening) of the underlying materials 203, 204, and 202 by magnetron sputtering, collimated sputtering or ionized sputtering and depend on deposition conditions such as pressure, plasma power, temperature and $Ar/N_2$ ratio. The higher the temperature, the plasma power and/or the Ar/N2 ration and/or the lower the pressure, results in better mechanical adhesion.

Figure 3:
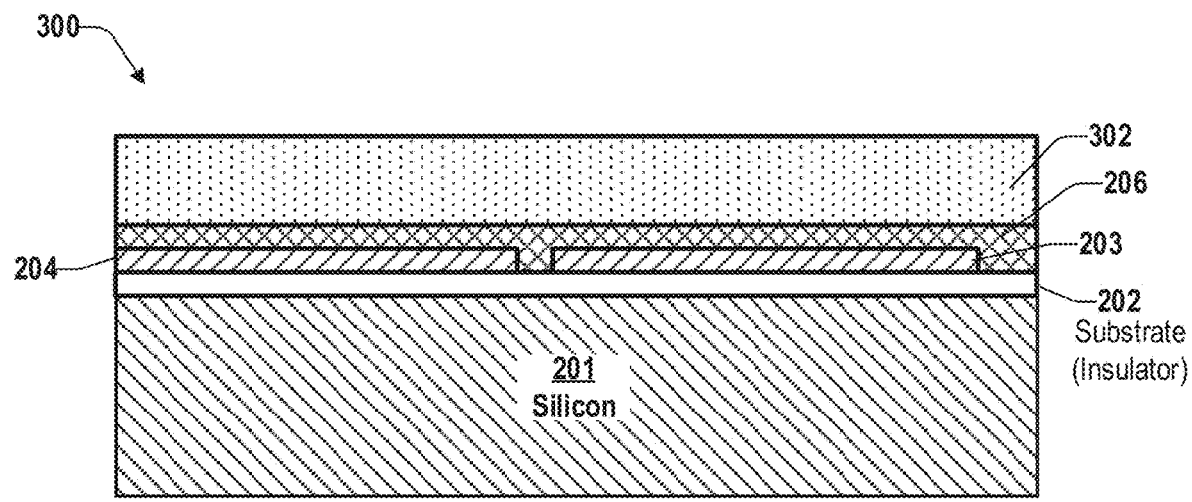
FIG. 3 is a side front-section view of a second layer of a hard mask, consistent with an illustrative embodiment.

FIG. 3 is a side front-section view 300 of a second layer 302 of the hard mask, consistent with an illustrative embodiment. The material of the second layer 302 of the hard mask is selected based on various considerations. First, the second layer 302 has material properties that allow it to be isotropically etched, as will be better understood in view of FIG. 7, discussed in more detail later. Second, the second layer 302 has material properties that provide an effective chemical and/or mechanical adhesion to the first layer 203, as well as the layer above it (i.e., third layer 402, discussed in FIG. 4).

Third, the second layer 302 has an etch selectivity that has a faster etch factor than the first layer 203. As discussed previously, the etch selectivity of the second layer 302 may have a faster etch ratio of at least 3 to 1 with respect to the first layer 206.

Fourth, the material properties of the second layer 302 enable an undercutting of the hard mask via an isotropic etch, thereby facilitating a delamination (i.e., undercut) of the third hard mask layer (of a final hard mask) in an etch step, such that the final hard mask floats away from the device that was fabricated under an opening and cavity of the hard mask (not shown in FIG. 3 but later in FIG. 7).

Fifth, in one embodiment, the second hard mask layer 302 is configured to have a thickness such that it is taller than all the film layers used to fabricate the semiconductor device via the hard mask opening 232 of FIG. 2A. As discussed previously, in one embodiment, the thickness of the second layer 302 is at least 2 times the height of the self-aligned device being fabricated to allow sufficient contact with the mask removal etchant after the device fabrication layers have been deposited In view of the foregoing considerations, the second layer 302 may comprise $SiO_2$, poly silicon (poly-Si), amorphous silicon (a-Si) a composite of silicon dioxide and poly-Si ($SiO_2$-poly-Si).

Figure 4:
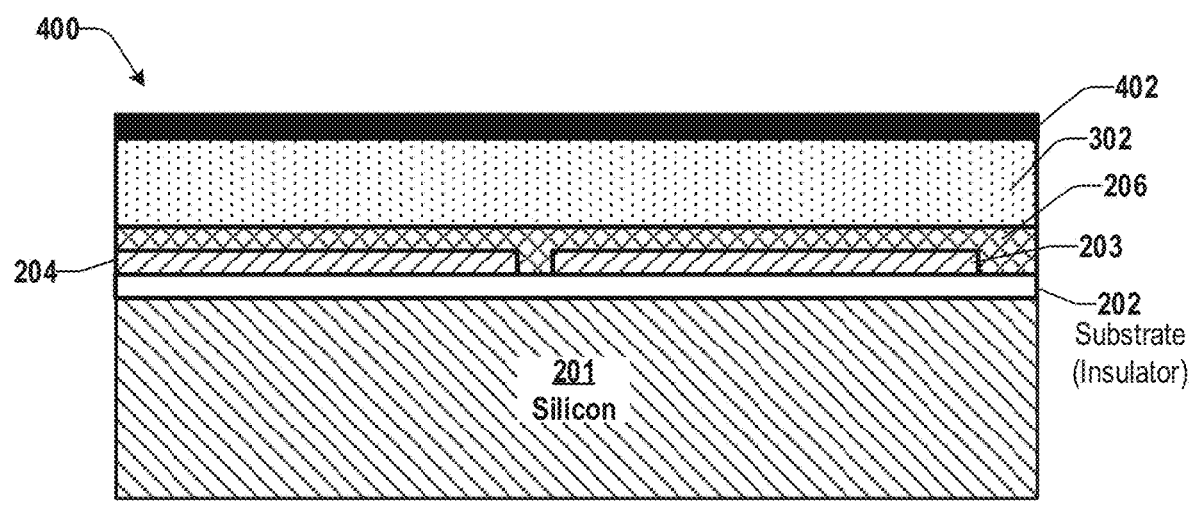
FIG. 4 is a side front-section view of a third layer of the hard mask, consistent with an illustrative embodiment.

FIG. 4 is a side front-section view 400 of a third layer 402 of the hard mask, consistent with an illustrative embodiment. The third layer 402 is subject to several considerations regarding the thickness and the selection of material(s). First, the third layer 402 has material properties that provide an effective chemical and/or mechanical adhesion to the second layer 302. Second, the third layer 402 has an etch selectivity that that has a smaller etch rate than the second and first layers (302 and 206) such that it can remain intact while the second and first layers (302 and 206) are etched via an opening, as illustrated later in FIG. 7.

Figure 8:
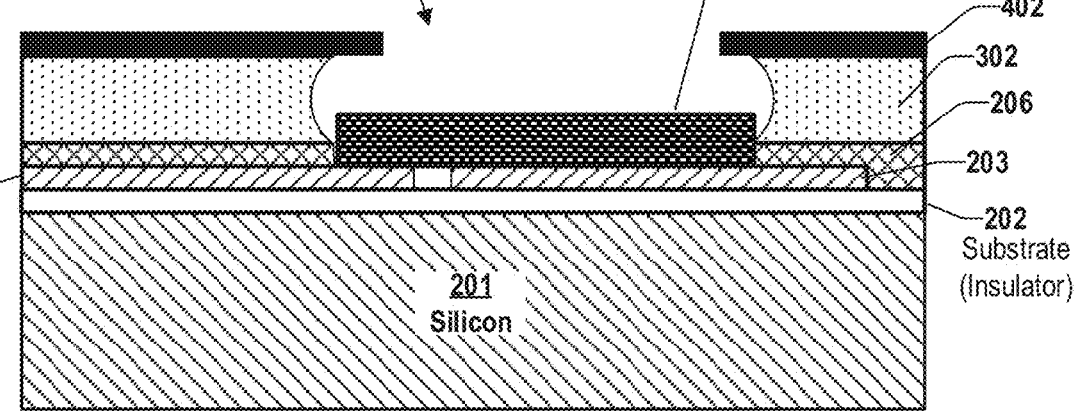
FIG. 8 illustrates an example deposition angle of a layer of a device being fabricated, consistent with an illustrative embodiment.

A third consideration of the third hard mask layer 402 is for it to have a composite strength that is higher than the first and second layers (206 and 302), which facilitates a thinner structure 402 that does not break off or droop when there is a cavity beneath it and device thin films are being deposited, as illustrated in FIG. 8. The thinner the third hard mask layer 402 is, the higher (i.e., more vertical) the deposition angle 804 can be for depositions of various materials related to the device being fabricated under an opening of the hard mask. As illustrated in FIG. 8, part of the device being fabricated 802 is created beyond the boundary of the opening 602, which is made possible by the deposition angle 804 used. Thus, the composite strength and the thickness of the third layer 402 are salient considerations because they facilitate higher deposition angles 804 of the device being fabricated under an opening 802 of the hard mask. In one embodiment, the thickness of the third layer 402 is one fourth (or less) the thickness of the second layer 302.

A fourth consideration of the third hard mask layer 402 is for it to be able to support photolithographic patterning thereon to create one or more openings (i.e., a pattern) in the hard mask, as will be discussed in more detail in FIG. 5.

In view of the foregoing considerations, the third layer 402 may be a composite $SiO_2$—$Si_xN_y$, $SiO_2$, $Si_xN_y$, a photosensitive polymer, etc., depending in part on the material used for the second layer 302, such that the third layer 402 provides an effective chemical and/or mechanical adhesion to the second layer 302 and has the structural integrity to prevent break off or droop with respect to the cavity beneath.

Figure 5:
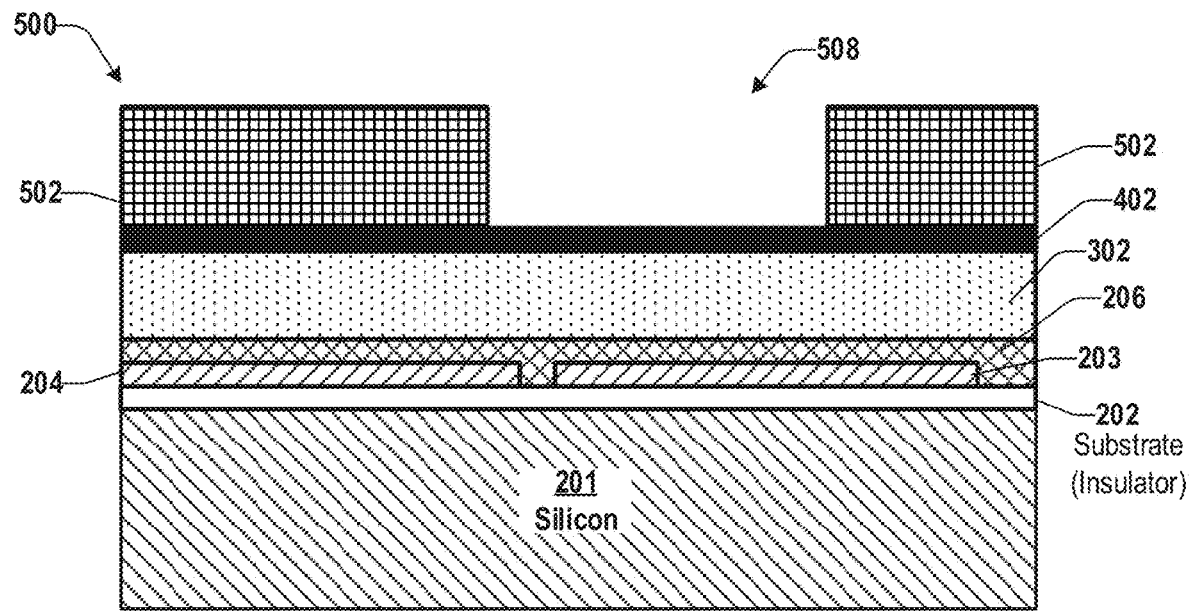
FIG. 5 illustrates a side front-section view of a photoresist layer on top of a third hard mask layer.

FIG. 5 illustrates a side front-section view 500 of a photoresist 500 layer that is applied, exposed, and developed on top of the third hard mask layer to create an outline of the dimensions of the openings of the hard mask. For example, the third layer of the hard mask 402 may be initially covered by a liquid solution of photoresist 502 (e.g., via spin coating on the wafer). The photoresist 502 may then be exposed to a pattern of intense light, which causes a chemical molecular bonding change that allows predetermined portions of the photoresist to be removed with a developer solution, thereby creating an opening 508 that delineates the dimensions of the desired opening of the hard mask.

Figure 6:
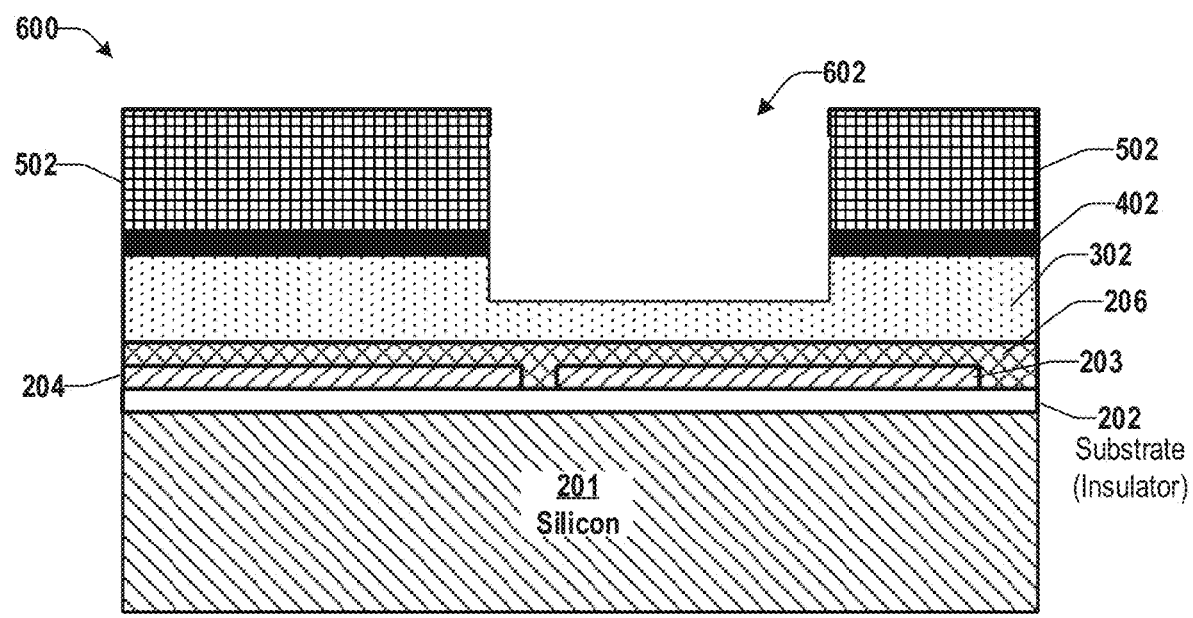
FIG. 6 is a side front-section view of a partial anisotropic etch of the third layer and part of the second layer to create an opening, consistent with an illustrative embodiment.

FIG. 6 is a side front-section view 600 of a partial anisotropic etch of the third layer 402 and part of the second layer 302 to create an opening 602, consistent with an illustrative embodiment. In one embodiment, reactive-ion etching (ME) is used in this step.

Figure 7:
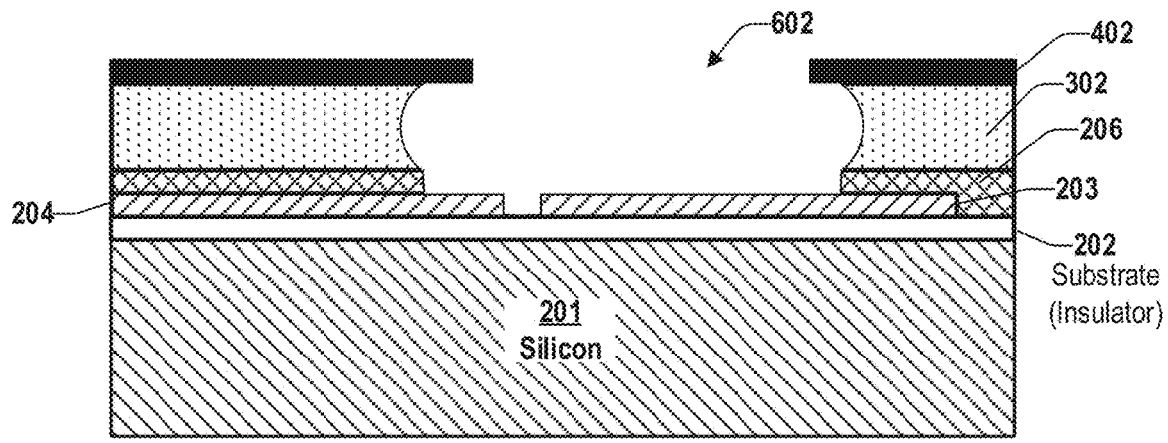
FIG. 7 illustrates a side front-section view of an isotropic etching that is operative to remove the photoresist layer, portions of the second hard mask layer, as well as portions of a first hard mask layer.

FIG. 7 illustrates a side front-section view 700 of an isotropic etching that is operative to remove the photoresist layer, portions of the second hard mask layer 302, as well as portions of the first hard mask layer 206. Accordingly, through the opening 602 of the third hard mask layer, the second and first layers 302 and 206 are etched, creating a larger opening below the etch mask of the third hard mask layer 402. In various embodiments, the etching may be by way of a liquid ("wet") or plasma ("dry") chemical agent that isotropically removes portions of the hard mask that are not protected by the third hard mask layer 402. For example, the isotropic etching that provides the structure of FIG. 7 can be accomplished by ME, wet chemical etching, or a combination thereof. As illustrated in FIG. 7, a wet etch allows a more curved etching, thereby providing a larger opening below the third hard mask layer 402. In this way, a single third hard mask layer 402 can be used for multiple layer depositions of the device being fabricated in the cavity below the opening 602.

Figure 9A:
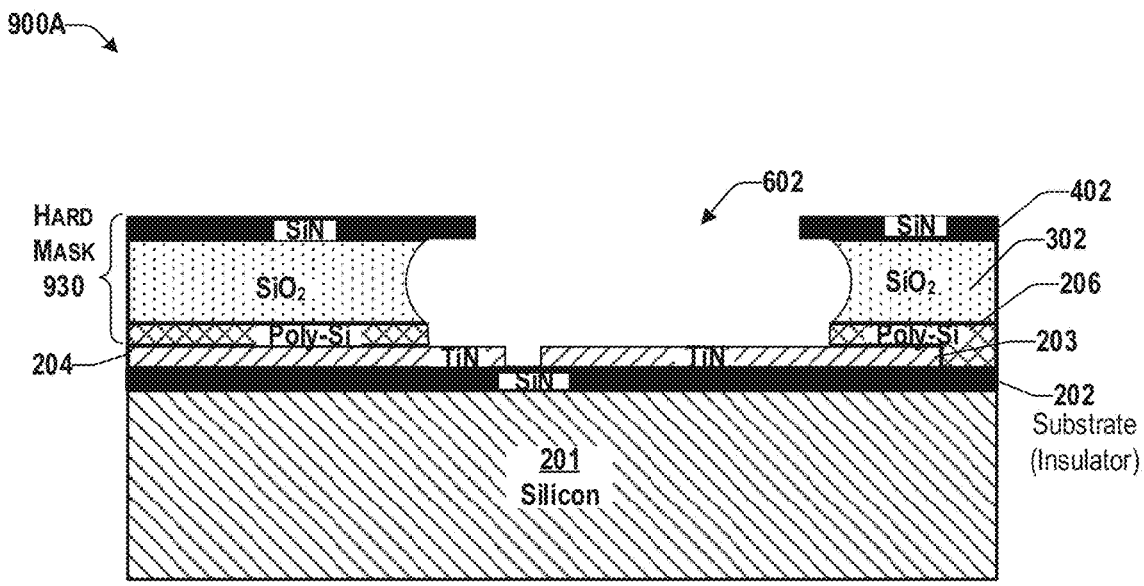
FIG. 9A is a side front-section view of a hard mask, consistent with an illustrative embodiment.
Figure 9B:
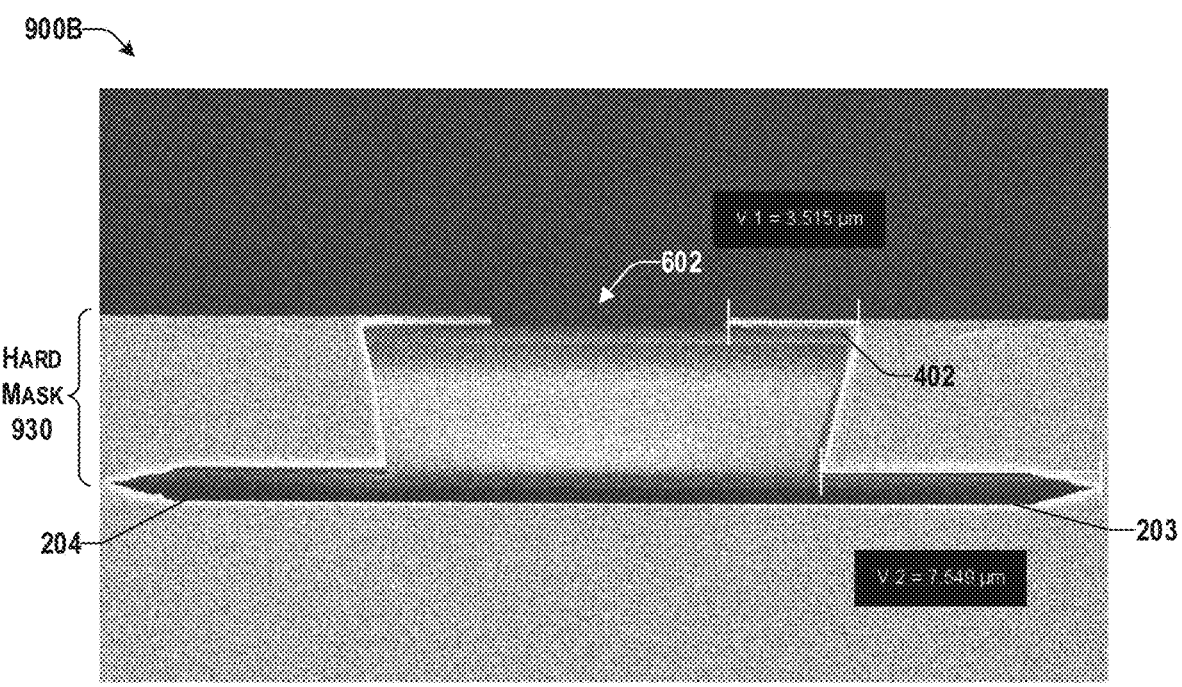
FIG. 9B is a scanning electron microscope photograph of a front-section view of a device having a hard mask similar to that of FIG. 9A.

FIG. 9A is a side front-section view 900A of a hard mask 930, consistent with an illustrative embodiment. FIG. 9B is a scanning electron microscope (SEM) photograph of a front-section view 900B of a device having a hard mask 930, similar to that of FIG. 9A. For example, the film material below the hard mask 930 may be patterned conductive metal (Al, Cu, Ni, TiN, etc.) electrodes. In the example of FIG. 9A, TiN electrodes 203 and 204 are used. The first hard mask layer 206 is poly-Si having a thickness of the second hard mask layer 302 is $SiO_2$ having a thickness of 4 μm, and the third hard mask layer 402 is SiN having a thickness of 200 nm. The substrate layer 202 is SiN having a thickness of 200 nm. The relatively thick $SiO_2$ (compared to the first layer 206) of the embodiment of FIG. 9A allows for taller structures to be built in the cavity under the opening 602. After the three layers 206, 302, and 402 forming the composite hard mask 930 have been anisotropically etched, a BOE etch follows that selectively etches the $SiO_2$ layer 302 and an additional ~3.5 μm laterally, which results in the 3.5 μm overhang of the third layer (402). An etch of $XeF_2$ follows, which selectively etches the poly-Si layer 206 an another 7.5 μm laterally, which results in the 7.5 μm overhang of the second layer (302). This embodiment teaches how to individually tailor a different dimensional opening for each layer 206, 302 and 402, forming the composite hard mask 930. In addition, the resulting hard mask 930 involves good surface tension matching to the underlying layers 202, 203, and 204, as explained below in the context of the discussion of FIG. 13.

The cavity etching conditions under the opening 602 may be based on a buffered oxide etch (BOE), sometimes referred to a buffered hydrofluoric (HF) acid etch, which is a wet chemical etch. It is used to etch thin films that etch with hydrofluoric acid, such as $SiO_2$ and to a lesser extent (to provide more selectivity) SiN, but buffered (added a chemical such as hydrochloric acid (HCl)) to control the etch rate (e.g., make it constant) as a function of film removal. Many un-buffered etch rates have a decreasing film thickness removal with time as the etchant builds up removal product from the thin film and eventually saturates to a non-etchant state, where no active etchant remains. In one embodiment, the mixture of concentrated HF (e.g., 49% HF in $H_2O$) to buffering agent ammonia fluoride ($NH_4F$) (e.g., 40% $NH_4F$ in $H_2O$)) of 1:6 ratio will etch good quality (thermally grown >950 C) $SiO_2$ at 2 nm/sec at room temperature, and somewhat quicker for lower temperature (less densely formed) deposited oxides. As etchant temperature increases, the etch rate increases.

Figure 10A:
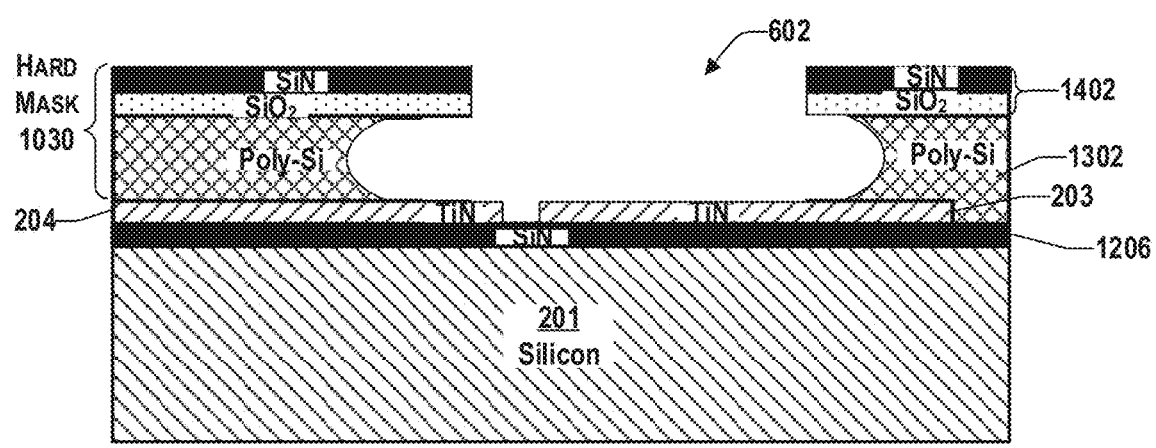
FIG. 10A is a side front-section view of a hard mask where the third layer is a SiN—SiO$_2$ composite, consistent with an illustrative embodiment.
Figure 10B:
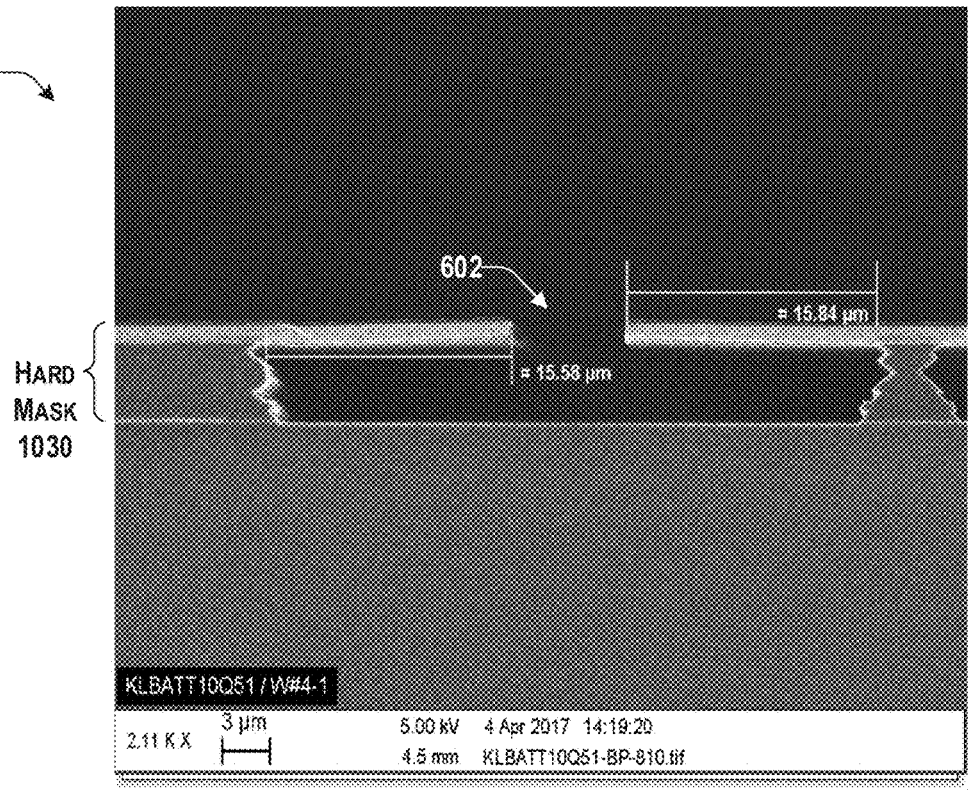
FIG. 10B is a scanning electron microscope photograph of a front-section view of a device having a hard mask similar to that of FIG. 10A.

FIG. 10A is a side front-section view 1000A of a hard mask 1030 where the third layer 1402 is a SiN—$SiO_2$ composite, consistent with an illustrative embodiment. The second layer 1302 comprises poly-Si and is substantially thicker than the third composite layer 1402. Note that, in one embodiment, the first layer of the hard mask can use the already deposited SiN insulator layer 1206 if all the first layer hard mask criteria are met, especially if the percent area coverage of layer 1206 (SiN) in contact with the second insulator layer 1302 (poly-Si) is substantially larger than the percent area coverage of layer 203 (TiN) and 204 (TiN) to provide the predetermined etch selectivity and adhesion. FIG. 10B is a scanning electron microscope (SEM) photograph of a front-section view 1000B of a device having a hard mask 1030, similar to that of FIG. 10A. The relatively thick layer of poly-Si 1302 (with respect to the first composite layer of SiN—SiO$_2$ 1402) of the embodiment of FIG. 10A allows for a faster etch rate and a clean lift-off (after all layers of the semiconductor device being fabricated have been deposited), since more undercut cross-sectional area of the second hard mask layer 1302 is exposed to the lift-off etchant. Further, having a thicker second layer 1302 of poly-Si than a composite third layer 1402 of SiO$_2$, provides good surface tension matching between the second layer 1302 and the composite third layer 1402. Further, it facilitates less processing time in an HF-based solution.

The cavity etching conditions under the opening 602 may be based on BOE that etches isotropically (i.e., vertically and laterally at the same rate on amorphous (non-crystalline) materials, with no preferred etch direction). In one embodiment, the SiN—SiO$_2$ composite layer 1402 has a thickness of After this top film (SiN—SiO$_2$) is etched (i.e., to create a rectangular opening), the next film (layer) that is etched is underneath and comprises the thick polysilicon layer 1302 (which, in various embodiments, can be between 1-10 μm thick), referred to herein as the second layer 1302. To that end, a dry gas etchant is used such as Xenon di-Fluoride, or XeF$_2$) to provide a good selectivity. Accordingly, the second layer 1302 (i.e., polysilicon) is etched vertically down, as well as etched horizontally (laterally). Due to the selectivity of XeF$_2$ (i.e. the relative high etch rate for silicon films such as polysilicon compared to the etch rate of the other surrounding films (including SiN, SiO$_2$, TiN)), there is an "undercut" of (removal of the film under) third composite layer 1402 of SiN—SiO$_2$.

By increasing the XeF$_2$ etch time, more material can be etched, and by virtue of the good selectivity between the third layer 1402 and the second layer 1302, the end result is faster etching of the second layer 1302, resulting in more "undercutting" of the third layer 1402. Stated differently, more overhang is created over the second layer 1302, the longer the time of the XeF$_2$ etch.

Figure 11A:
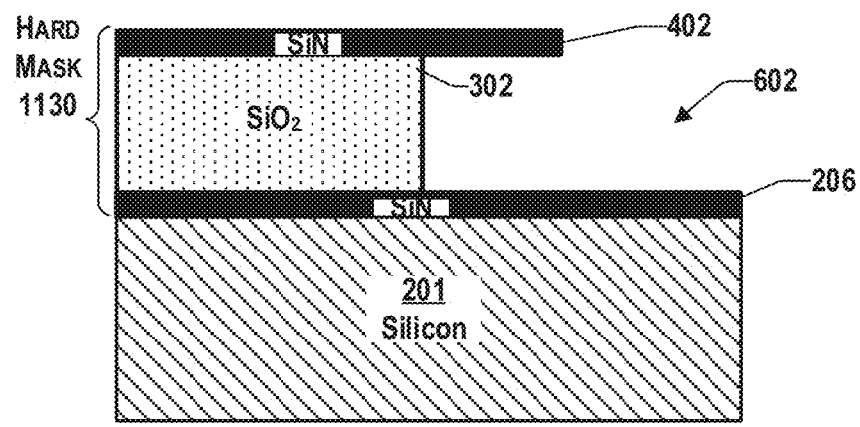
FIG. 11A is a side front-section view of a hard mask where a polysilicon layer is not used, consistent with an illustrative embodiment.
Figure 11B:
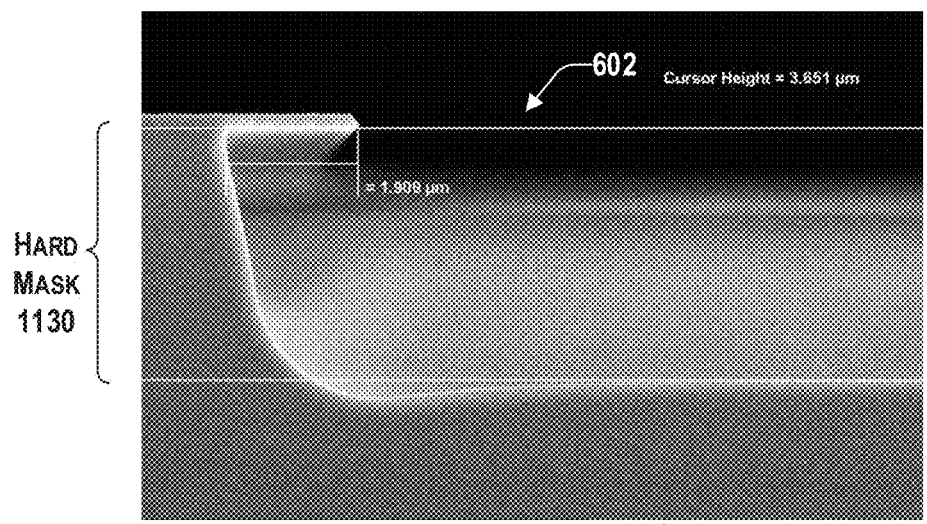
FIG. 11B is a scanning electron microscope photograph of a front-section view of a device having a hard mask similar to that of FIG. 11A.

FIG. 11A is a side front-section view 1100A of a hard mask 1130 where another layer other than polysilicon can be used, consistent with an illustrative embodiment. FIG. 11B is a scanning electron microscope (SEM) photograph of a front-section view 1100B of a device having a hard mask 1130, similar to that of FIG. 11A. For simplicity, metal electrodes are not shown in FIG. 11A. By virtue of having a hard mask 1130 based on a third layer SiN over a second layer SiO$_2$ over a first layer SiN (i.e., referred to herein as a pure SiN—SiO$_2$—SiN) hard mask) a lower temperature deposition (e.g., down to 200 C) can be used, which better accommodates various temperature sensitive self-aligned devices being fabricated with the hard mask 1130. For example, temperature sensitive self-aligned devices would include solid-state Lithium-metal (Li) and Lithium-air batteries, GaN and III-V optical devices, etc. Further, a less expensive wet etch process can be used (i.e., a setup for a dry etch process is not required).

In one embodiment, the cavity etching conditions under the opening 602 may be based on BOE etch of 3.65 μm of SiO$_2$ at an etch rate of 135 nm/min.

Referring back to FIG. 9A, as discussed previously, the film material below the hard mask 930 determines the composite hard mask film composite so as not to etch or deteriorate the below film material when a hard mask opening 602 is etched. If, for example, the metal electrodes were of aluminum (Al), which is etched rapidly by buffered oxide etch and buffered HF, the adjacent first hard mask layer (e.g., film) 206 should not be an oxide. Rather, Si$_x$N$_y$, would be a good choice for passivating the metal electrodes. This material would serve as an effective barrier to the diffusion of water and sodium. Such impurities may cause devices to corrode and become unstable. Another consideration with Al electrodes is the relatively low melting point, were subsequent film (including hard mask films) deposition temperatures should be kept below approximately 450 C. Oxides, nitrides, and amorphous silicon (a-Si) can be deposited with various methods below 450 C.

The choice of a particular film forming deposition reaction for the hard mask may be determined by the deposition temperature, which should be compatible with the materials of the self-aligned device being fabricated that are already deposited on the substrate. FIG. 12 is a table of gas reactions for depositing films. More particularly, table 1100 provides the chemistry of gases and the corresponding temperature of deposition for each film compatible in hard mask layers. FIG. 13 is a table 1300 of film properties for different deposition methods. Among other features, table 1200 indicates that plasma nitride films deposited by reacting SiH in a N$_2$ plasma are more compressive than plasma nitride produced from SiH and NH$_3$. Similarly, films deposited at low frequencies are compressive, rather than tensile. A SiN plasma deposited at frequencies of 13.56 MHz has a tensile stress of approximately $4 \times 10^6$ dyn/cm$^2$, whereas a similar film deposited at a frequency of 50 kHz has a compressive stress of $2 \times 10^9$ dyn/cm2. By following the conditions of tables 1100 and 1200, the wafer throughput, film stress buildup that may affect film adhesion, and etch selectivity can be adjusted.

The hard masks discussed herein facilitate the formation of various devices being fabricated in the cavity below its opening. Since the hard mask layer remains fixed during the fabrication of the device, the different thin film device layers that are deposited are self-aligned. Thus, by virtue of using the same hard mask pattern during the fabrication process of a device, such as a solid state thin film battery, the device (battery in this example) is self-aligned and the process of creating the device is simplified compared to other processes that use additional mask layers for the deposition of films. Such self-alignment not only provides more precise fabrication results, but also facilitates scalability and further miniaturization. Stated differently, since various layers that may be used to fabricate a device are self-aligned by virtue of using a single hard mask pattern for various film depositions of the device, regions that are typically wasted are avoided, thereby yielding a more compact device size. More accurate alignment of films layers and smaller dimensions are now possible since they depend only on the deposition angle and not on any mask-to-mask alignment resolution of previous methods.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits, and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A method of creating a hard mask for the fabrication of a self-aligned semiconductor structure, the method comprising:
    depositing a first layer configured to provide at least one of a chemical and a mechanical adhesion to a layer immediately below it and having an etch selectivity that is faster than the layer immediately below it;
    depositing a second layer located on top of the first layer and having an etch selectivity that is faster than the first layer;
    depositing a third layer located on top of the second layer and having:
        an etch selectivity that is slower than the second and first layers; and
        a composite strength that is higher than the first and second layers; and
    isotropically etching the second layer and the first layer to create overhang regions of the third layer.

2. The method of claim 1, further comprising depositing a photoresist layer on top of the third layer.

3. The method of claim 2, further comprising anisotropically etching the third layer and part of the second layer through an inner opening.

4. The method of claim 3, further comprising chemically removing the photoresist above the inner opening.

5. The method of claim 1, wherein the anisotropic etch of the third layer and part of the second layer is via reactive-ion etching (RIE).

6. The method of claim 1, wherein:
    the etch selectivity of the first layer is faster by at least a 10 to 1 ratio with respect to the layer immediately below it; and
    the etch selectivity of the second layer is faster by at least a 3 to 1 ratio with respect to the first layer.

7. The method of claim 1, wherein the thickness of the third layer is smaller than each of the first and second layers.

8. The method of claim 1, wherein:
    the first layer comprises polysilicon (poli-Si);
    the second layer comprises silicon dioxide ($SiO_2$); and
    the third layer comprises silicon nitride (SiN).

9. The method of claim 1, wherein:
    the first layer comprises silicon nitride (SiN);
    the second layer comprises silicon dioxide ($SiO_2$); and
    the third layer comprises silicon nitride (SiN).

10. The method of claim 1, wherein the second layer is at least twice a total height of all the layers used in the fabrication of the self-aligned structure.

11. The method of claim 1, wherein the second layer has material properties that allow it to delaminate more readily than the first and third layers during a hard mask removal etch, such that the hard mask floats away from the fabricated self-aligned structure.

12. The method of claim 1, further comprising delaminating the second layer during a hard mask removal etch, such that the hard mask floats away from the fabricated self-aligned structure.

13. The method of claim 12, wherein the removal of the hard mask comprises an isotropic etch based on at least one of: (i) a buffered oxide etch, (ii) a hydrofluoric acid (HF) etch, and (iii), a $X_eF_2$ plasma etch.

14. The method of claim 1, wherein a compressive strength of a material of the second layer substantially cancels out a tensile stress of the third layer.

15. The method of claim 1, wherein the first layer is of a patterning hard mask.

16. The method of claim 15, wherein the second layer is of the patterning hard mask.

17. The method of claim 16, wherein the third layer is of the patterning hard mask.

* * * * *